United States Patent
Canonico et al.

(10) Patent No.: US 10,907,301 B2
(45) Date of Patent: *Feb. 2, 2021

(54) METHOD FOR MAKING PARTIALLY METALLIZED PRECISION SYNTHETIC THREAD SQUARE MESH FABRICS FOR AESTHETIC OR MARKING APPLICATIONS

(71) Applicant: SAATI S.P.A., Appiano Gentile (IT)

(72) Inventors: Paolo Canonico, Appiano Gentile (IT); Carmine Lucignano, Appiano Gentile (IT)

(73) Assignee: SAATI S.P.A., Appiano Gentile (IT)

( * ) Notice: Subject to any disclaimer, the term of this patent is extended or adjusted under 35 U.S.C. 154(b) by 798 days.

This patent is subject to a terminal disclaimer.

(21) Appl. No.: 14/429,310

(22) PCT Filed: Jul. 23, 2013

(86) PCT No.: PCT/IB2013/001632
§ 371 (c)(1),
(2) Date: Mar. 18, 2015

(87) PCT Pub. No.: WO2014/045088
PCT Pub. Date: Mar. 27, 2014

(65) Prior Publication Data
US 2015/0225890 A1  Aug. 13, 2015

(30) Foreign Application Priority Data

Sep. 18, 2012 (IT) .............................. MI2012A1541

(51) Int. Cl.
| | |
|---|---|
| *D06M 10/00* | (2006.01) |
| *D06M 11/83* | (2006.01) |
| *D06M 23/16* | (2006.01) |
| *B23K 26/361* | (2014.01) |
| *C23C 16/56* | (2006.01) |
| *H05K 3/02* | (2006.01) |
| *H05K 1/03* | (2006.01) |

(52) U.S. Cl.
CPC ......... *D06M 10/005* (2013.01); *B23K 26/361* (2015.10); *C23C 16/56* (2013.01); *D06M 11/83* (2013.01); *D06M 23/16* (2013.01); *H05K 1/038* (2013.01); *H05K 3/027* (2013.01); *H05K 2203/107* (2013.01); *Y10T 428/2481* (2015.01)

(58) Field of Classification Search
CPC .... B23K 26/361; C23C 16/56; D06M 10/005; D06M 11/83; D06M 23/16; H05K 1/038; H05K 2203/107; H05K 3/027; Y10T 428/2481
See application file for complete search history.

(56) References Cited

U.S. PATENT DOCUMENTS

| | | |
|---|---|---|
| 2009/0181592 A1 | 7/2009 | Dugan |
| 2010/0118243 A1 | 5/2010 | Majumdar |
| 2011/0217892 A1 | 9/2011 | Chabrecek |

FOREIGN PATENT DOCUMENTS

| | | | |
|---|---|---|---|
| DE | 202008017480 U1 | | 4/2010 |
| EP | 2461658 A1 | | 6/2012 |
| KR | 771071 B1 | * | 10/2007 |
| WO | 2009/029119 A1 | | 3/2009 |

OTHER PUBLICATIONS

International Search Report in corresponding application dated Nov. 5, 2013.

* cited by examiner

*Primary Examiner* — Elizabeth C Imani
(74) *Attorney, Agent, or Firm* — Hedman & Costigan, P.C.; James V. Costigan; Kathleen A. Costigan

(57) ABSTRACT

A method for making, by a laser etching, a partially metallized single thread fabric material for aesthetic or marking applications, does not use polymers, inks, pastes and additives. The inventive method comprises a pre-metallizing step or a partial metallizing on the fabric and a following metal removal step, being performed by a quick and localized evaporation thereof, performed either on one or both the surfaces simultaneously, by a specifically designed laser.

10 Claims, No Drawings

METHOD FOR MAKING PARTIALLY METALLIZED PRECISION SYNTHETIC THREAD SQUARE MESH FABRICS FOR AESTHETIC OR MARKING APPLICATIONS

This application is a 371 of PCT/IB2013/001632 filed Jul. 23, 2013.

BACKGROUND OF THE INVENTION

The present invention relates to a method for making partially metallized precision synthetic thread square mesh fabrics for aesthetic or marking applications.

As is known, to make signs, patterns, images, logos, wordings or other aesthetic or marking geometrical patterns on a synthetic single thread fabric material, with a large size and by quick processes, is a very difficult operation.

For transferring ink, polymeric or paste materials to a fabric, conventional printing methods, such as a screen printing or ink jet process, while performing modifications making the process a very complex and expensive one, may be used.

Thus, it is usually provided to use adhesive disposable strips or tapes to be applied on the fabric material bottom, to prevent printing ink from leaking, or to perform a printing operation on the disposable strips, the printed patterns being then transferred to the fabric through suitable adhesives.

Without taking proper measurements, making conventional printing processes very complex, it is nearly impossible to transfer the printed patterns to the fabric; moreover flashing and curtaining phenomena frequently occur, negatively affecting the desired end printed patterns.

In this connection it is should be also pointed out that, even if proper measurements are adopted, the printed pattern is made on only one face of the fabric material.

Moreover, for aesthetic reasons, it is sometimes necessary to provide the fabric with a metallized effect, which may be hardly reproduced by filled-in polymeric materials.

Thus, in such a case, it is necessary to carry out a fabric material metallizing process.

Moreover, when patterns must be reproduced on a metallized fabric material, it is necessary to properly modify the above mentioned process and apply it to a pre-processed metallized fabric.

It is also known to process fabric materials by the so-called chemical etching process, in which the material removal is carried out by radical chemical reactions on the fabric substrate, said chemical etching process providing set patterns on the metallized fabric.

A first stage of the chemical etching process comprises preparing functional templates for forming a desired pattern on the metallized fabric material, and transferring, by a photolithographic or photoetching process, the made pattern from the template to a thin layer of a material sensible to UV radiation, and then covering the textile substrate surface.

The photolithographic steps are as follows:
applying a photosensitive film (resist) on the substrate;
exposing to a UV radiation the resist film at regions thereof not covered by the pattern defined on a photolithographic template contacting the substrate;
developing the resist film at the exposed regions thereof (a positive process);
etching the metal film underlying the photo-sensitive film at the non covered region of the latter;
stripping.

Development is that process which greatly affects the pattern quality.

The etching is a process used for patterning elements, comprising eliminating the excess metal, thereby leaving only target metal regions.

The stripping or removing is usually made by an acid bath.

The etching reagent, etching time, temperature and stirring are process controlling parameters.

The stripping is a process step for removing the remaining photosensitive film.

Said stripping step must not deteriorate the underlying metal layer and must not contaminate it.

SUMMARY OF THE INVENTION

The aim of the present invention is to provide a novel method for making partially metallized precision synthetic thread square mesh fabrics for aesthetic or marking application, overcoming the above mentioned prior art drawbacks and which is fully independent of conventional printing processes, and accordingly, of polymers, ink, paste and additive materials.

Within the scope of the above mentioned aim, a main object of the invention is to provide images, logos, wordings, patterns and any desired types of signs and aesthetic and marking geometry patterns on partially metallized precision synthetic thread square mesh fabrics, without adding paste, ink or additive materials and without performing printing processes, but a selective removal of the deposited metal material.

Another object of the present invention is to provide aesthetic and marking fabric materials, without altering the fabric material porosity, thereby preserving its perspiring or general mesh opening, acoustic and filtering properties.

The method according to the present invention allows to integrate all the functions typically characterizing a square mesh synthetic single thread fabric material which differentiate the latter from a conventional fabric or substrate such as a continuous film or material, with an aesthetic and/or marking function.

Yet another object is to provide such a method which may be carried out by a roll-to-roll process, and which, accordingly, allows to continuously operate without requiring process operations on "sheet" elements.

The method according to the present invention comprises a step of applying a metal on an overall surface of a synthetic single thread fabric surface, followed by an excess metal removal step to provide a preset pattern.

The substrate used in the method according to the present invention is a synthetic single thread precision square mesh fabric, having a very even construction and mesh opening therethrough, high mechanical strength and processing characteristics, thereby making a precision single thread fabric an ideal base material for all applications requiring optimum elastic, lightness, perspiring, precision and performance evenness characteristics.

The above mentioned fabric materials are very even materials with very constant weight, thickness, surface characteristics, temperature performance, improved with respect to other flexible substrates, such as polymeric films, TNT, multiple thread fabric materials, paper and so on.

The above evenness is held through the overall fabric roll and from a fabric batch to another fabric batch.

The subject fabric materials are made with very narrow tolerances, thereby providing a textile substrate having very improved flow permeability and geometric properties, and a highly reproducible aesthetic capability.

The above evenness is a result of constant pore dimensions and properties of the single thread used in weaving the fabric material.

Moreover, the inventive precision fabric materials have a very good resistance against atmospheric agents, water and moisture and are made on an industrial scale with a stable and reproducible quality.

The preferred inventive synthetic single thread square mesh precision fabric materials are made of a polyester, polyamide, polypropylene, polyethersulphone, polyimide, polyamideimide, polyphenylensulphide, polyetheretherketone, polyvinylidenfluoride, polytetra-fluoroethylene with a mesh opening from 2,500 to 0 micron. The single thread fabric material textile construction may have the following characteristics: (4-600 cm threads), thread diameter (10-500 microns), waving, weight (15-300 g/square meter), thickness (15-1,000 microns).

Each said fabric material may be used as a substrate for reproducing aesthetic patterns.

According to the present invention, a method is carried out for making integrating patterns on a textile base, by a distinctive process including a combination of several technologies or methods.

The method according to the present invention may be applied to other flexible substrates, such as polymeric films, TNT, multi-thread fabrics, paper, membranes, non-woven materials, natural fiber fabrics.

The result is a patterned fabric material, for aesthetic purposes and target applications, with improved flexibility, lightness, integration, size and dimension features.

The process comprises an applying step of applying a metal on one or both surfaces of the synthetic single thread fabric material preferably carried out, according to the present invention, by sputtering or a galvanic deposition or alternately by CVD, PVD, a chemical deposition or a lamination of different metal sheets on the synthetic single thread fabric.

The removal of the metal material is carried out by a quick and localized evaporation of said metal material, by a "laser etching" process, applied to metal coated fabric materials by the above mentioned methods.

The above disclosed process may also be applied to a broad range of synthetic single thread fabric materials, which are differentiated from one another because of the chemical nature of the weaving single thread, for making a textile construction (threads/cm, thread diameter, weave, weight, thickness) for the finishing and surface treatments (a "white" fabric, being washed and thermoset, a colored fabric material, a plasma processed fabric, a metallized fabric, and so on).

The two above process stages and related methods, may be applied at the most suitable combination for achieving the desired aesthetic pattern.

The sputtering coating is one of the most flexible methods for physically depositing a metal or non-metal coating on a textile surface.

The coating material is filled in the vacuum chamber as a cathode, in the form of a metal plate.

After having put the processing chamber under vacuum, a process gas is fed thereinto (argon is herein typically used because of its high atomic weight).

A set voltage is then applied and the gas is fed into the chamber.

The gas positive ions are subjected to an accelerating process on the negative cathode thereby ejecting the metal plate atoms to deposit them on the single thread fabric arranged in the chamber in a homogeneous and even manner.

Differently from other vacuum depositing methods, no fusion of a material is herein made and, accordingly, the materials (mainly metals and alloys thereof, but also other organic materials) may be deposited with a high depositing efficiency and precise control.

The metals and alloys used herein comprise steel, titanium, copper, aluminium, chromium and noble metals.

By the same method and equipment it is also possible to carry out a reactive sputtering: in addition to the above mentioned gas, a reactive gas such as nitrogen or oxygen is also fed into the processing chamber, nitrides or the deposited metal oxides such as $TiO_2$ or TiN are generated on the substrates.

The sputtering method may also be carried out on both insulating and conductive single thread fabric materials.

A number of cathodes, consisting of different materials, may be introduced into a sputtering system, to make multilayered systems.

Moreover, it is possible to modify the combination of the individual layers, by changing the reactive gas combination.

The thickness of the coating thus made ranges from ten nm to microns.

In the so-called "magnetron sputtering" method, the depositing system comprises a passive device generating a magnetostatic field.

The electrically charged ions and particles (which are subjected to the Lorentz force) are offset from the field flow line configuration, thereby impinging several times against a target layer to be deposited, thereby greatly increasing the process efficiency, since a larger material amount is added to the plasma.

The process parameters are changed to provide metal layers having different properties (conductivity, thickness, weight ($g/m^2$) of the deposited layer).

The process may be controlled by controlling the process parameters (the speed of the substrate being processed, generator power, and so on) of the target in the processing chamber and the environment conditions (pressure, vacuum degree, used gases).

The sputtering method provides very good quality conductive films and, by specifically designed modifications, surface and aesthetic properties different from those of the starting material, in a bulk phase.

The sputtering method provides moreover several surprising combined advantages: it is a very clean coating and economically efficient method providing a very thin and even coating.

Moreover, it is a dry low temperature process, without chemical or thermal etchings of the textile substrate, which preserves its basic structural characteristics.

Moreover, sputtering provides an indestructible binding of the film to the substrate, since it welds them at a molecular level, with an operating flexibility larger than that of other coating methods; in addition, being a cold process, it may also be used for depositing a broad range of conductive, semiconductive and insulating materials on any desired type of single thread fabric materials.

The galvanic electrodepositing process provides making metal coatings on a given surface due to an electric current.

The metal and alloy electrodepositing method comprises an aqueous solution electrolysis, the main components of which are the coating metal salts.

In a basin, forming the so-called galvanic bath, containing an aqueous solution of the metal salt to be deposited, two electrodes are arranged.

Across said two electrodes, a voltage source applies a potential difference.

In such a condition, the cations of the metal being deposited are driven toward the cathode (which is negatively charged) whereas the anions are displaced toward the anode (which is positively charged).

Because of the electric field generated by the potential or voltage difference applied between the two generator electrodes, cations migrate toward the negative pole, and anions toward the positive one, thereby an electric current will flow through the solution.

Upon contacting the electrodes, the solution ions are subjected to an oxidation-reduction reaction, with an electron transfer, respectively a cathode reduction and anode oxidation.

In the electrolytic cell, the articles to be coated are coupled to the current source negative pole and form the cathode, whereas the anode is coupled to the positive pole thereby closing the electric circuit.

The metal cations, in a free condition in the solution, are discharged on the cathode surface which is slowly coated by a thin metal layer.

The anode preferably comprises plates or bars of the metal to be deposited and, during the electrolysis, it is consumed to make up the ion solution discharged on the cathode.

The electrodeposition process may comprise both noble metals such as silver, gold, and common metals such as nickel, iron, zinc and copper.

The deposited crystalline structure, affecting the article mechanical and physical properties, such as conductivity, surface hardness, abrading resistance, and evenness, is controlled by the main operating parameters listed hereinbelow: composition and concentration of the bath electrolyte, current density, voltage applied to the electrodes, temperature, pH, galvanic bath stirring.

With respect to the metal layer being deposited, which is of tens of microns or less, for a given value of the current density (expressed in $A/dm^2$), at which the bath operates, and knowing the depositing speed or rate, it is sufficient to properly set the time required to form the desired deposit thickness.

A laser ablating process for processing a metallized synthetic single thread fabric material, by one of the above techniques, will be now disclosed.

The method provides a quick and localized evaporation of the metal, on either one or both the surfaces thereof simultaneously, by a specifically designed and selected laser source, preventing any combustion, melting or fabric degradation phenomena.

The method comprises the step of providing a cooling system for preventing the fabric from being subjected to degradation phenomena as said metal is laser beam vaporized by a combination of the metal evaporation latent heat and thickness of said metal to achieve a level of heat that is conductively transferred to the polymeric substrate.

The materials subjected to the laser ablating process are polymeric single thread fabric materials with a metal coating on one of both surfaces thereof, and having different textile construction, weight, thickness and metallization (said metals, alloys and semiconductors being preferably selected from nickel, gold, steel, copper, silver, aluminium, titanium, chromium, tin, indium-tin oxide, zinc-aluminium oxide, tin-fluorine oxide, tin-antimonium oxide).

The laser beam will be "absorbed" by the metal coating, without modifying its polymeric bulk, since said coating is transparent to the laser beam.

Said laser beam is a low power and high density beam, has a wavelength of preferably about 1,000 nm, or from 1,080 to 354 nm. It may operate in a continuous or a pulsed regimen with a frequency preferably from 100 Hz to 500 MHz.

The pulse duration is preferably from 200 ns to 10 femtoseconds, to improve the evaporation of the metal layer and restrain the heat diffusion to the bottom substrate.

In such an application, a diode laser is preferably used but, by suitable modifications, also a solid status laser, a fiber laser, or a CO2 laser may be used.

The laser beam is focalized on the metallized fabric material by a lens focalizing system, with a micrometrical adjustment of the lens movement, whereas the movement of said beam on the fabric material is carried out by Cartesian axes, a robot arm, a lens system and/or one or more reflecting mirrors with a galvanometric head.

Moreover, the laser beam is driven on the fabric material by a combined movement of the beam and fabric material, that is by any of the above disclosed methods, simultaneously to a displacement of the fabric material which, in each case, is held under a low tension between two supporting members (preferably a fabric roll is slidably driven, under a small pulling and counter-pulling force, under the laser head).

If multilayered metal coatings are subjected to an ablating process, in which a combination of a metal coating thickness and evaporation latent heat has a level causing a heat transfer to the polymeric substrate (by heat conduction) susceptible to damage or melt the polymeric bulk, then a cooling system for achieving a quick heat removal is advantageously used.

For example it is possible to use a forced air convection or a refrigerating fluid system, or a bath, by partially immersing the fabric in a cooling basin. In some cases, if the thickness or, in general, the amount of the material to be removed is a significative one, then it is advantageous to use suction systems to prevent removed metal particles from being conveyed to the plume and again deposited on the fabric surface, thereby negatively affecting the pattern aesthetic characteristics.

The laser ablation process, applied to the metallized single thread fabric, comprises to select an optimum wavelength which is absorbed by the metal material and passes through the polymer (constituting the synthetic single thread) without absorptions.

The laser beam having a set laser wavelength may impinge/operate on the single thread fabric on both faces of the latter; it is absorbed by the metal and removes it by evaporating, while passing through the polymer transparent to the laser wavelength, without etching or modifying said polymer, and being absorbed by the underlying metal material thereby removing it by evaporation.

The laser sources used in tests carried out on different fabrics, having different thread chemical composition, textile weave (threads/cm, thread diameter, weave, weight, thickness), finishing and metallization arrangements, were two: a laser source having a maximum power of 10 W and an emitting wavelength of 1,064 nm, with a minimum spot size of 50 microns, and a fiber laser source with a maximum power of 30 W, an emitting wavelength of 1,070 nm, and a minimum spot size of 80 microns.

With a spot decreasing size, it is possible to achieve enhanced resolution values, even if the end result is greatly affected by the substrate, that is by the thread/cm number and thread size.

As the thread diameter decreases, the thread/cm number increases, and also the resolution increases.

Both the sources operate in a pulsed regimen and comprise a galvanometric laser beam driving system.

By the above disclosed method it is possible to preserve all the distinctive advantages of a laser machining process: the precision and contour levels on the image or pattern, a desired repetition rate, very short operating times, a processed material loading and unloading system (in a case of a roll processed textile material it is possible to use a conventional winding and unwinding system), a very flexible electronic control of the overall equipment allowing to change and quickly modify the pattern to be reproduced by a computer.

Differently from a chemical etching process, for example, the speed of which is much slower, which does not allow to process fabric rolls and requires dedicated templates for making the different patterns.

A number of samples have been made and characterized by the two above disclosed laser assemblies, on different fabrics as to the thread chemical composition, textile construction (threads/cm, thread diameter, weave, weight, thickness) and metallization: PES 90.64 metallized by stainless steel, PES 150.27 metallized by stainless steel, PES 180.27 metallized by stainless steel, PES 190.31 metallized by stainless steel, PES 90.40 metallized by nickel, PES 165.34 metallized by nickel, PA 43.61 metallized by nickel, PES 90.64 metallized by copper, PES 190.31 metallized by copper, PA 43.61 metallized by copper, PES 90.64 metallized by aluminium, PES 150.27 metallized by aluminium, PES 180.27 metallized by aluminium, PES 190.31 metallized by aluminium, PES 40.90 calendered and metallized by titanium, PES 90.64 metallized by titanium, PES 150.27 metallized by titanium, PES 180.27 metallized by titanium, and PES 190.31 metallized by titanium.

In the above mentioned codes, the first digit after the word identifying the polymer, is related to the number of threads/cm of the fabric, whereas the second digit identifies the thread diameter.

In each single case, the method is started according to a laboratory arrangement generating squares by changing the process parameters, to identify an optimum operating condition combined window.

From operating tests it has been found that the removal of the metal is a full one and does not damage the polymer.

As above mentioned, it has been found that, as the spot size decreases, the minimum size of the removed material trace correspondingly decreases, which, in any case, depends on the substrate fabric.

After having found the optimum process parameters depending on the specific fabric type and metals, much more complex patterns have been made for a demonstrating purpose: a reproduction of wordings, images and photos, with a shaded color effect.

In addition to the basic characteristics of the square mesh synthetic single thread fabric, differentiating the latter from a conventional fabric or substrate such as a film or continuous material, the inventive method allows to add an aesthetic or marking functionality by a quick, flexible method which may be implemented in a roll-to-roll process.

The method is suitable for several applications, in many fields, from a mere design to an acoustic sector, automotive sector, household appliances, healthcare, medical diagnostic, chemical consumer goods, military logistics, publishing.

More specifically, it is generally adapted to be used in all applications requiring a high operating flexibility, an evenness of the achieved characteristics, such as weight, thickness, a high precision and good perspiring and heat dissipating characteristics.

The broad range of the achieved products allows to provide modular solutions such as for a filtering application, that is to select the substrate providing the improved approach (mesh opening, thread diameter, threads/cm), substrate color, type, colors and layers of metal materials to be deposited to achieve the desired aesthetic effect.

The flexibility and mechanical properties of the fabrics are further improved with respect to conventional films and, moreover, the synthetic single thread fabric materials have very good processing properties (such as sealing or welding, cutting, drilling and so on) which involves a good mating and assembling facility.

It has been found that the invention fully achieves the intended aim and objects.

In fact, the invention has provided a method which is completely away from conventional printing processes, and accordingly from a use of polymers, inks, pastes and additives, which may be suitably applied to the synthetic single thread fabric or optionally to a pre-metallized synthetic single thread fabric material.

The inventive method comprises to use a starting metallizing step or a partial metallization of the fabric material and a subsequent metal removal, being carried out by a quick and localized evaporation of the latter, which may be performed either on one or both the fabric surfaces simultaneously, by the disclosed laser source.

The pattern may be made either as a negative or positive pattern on the metallized fabric, on one or both the surfaces thereof simultaneously, depending on the desired aesthetic effect.

Moreover, the fabric material used as substrate, to be further metallized, may be a white fabric or a pre-colored one, to provide a desired aesthetic effect as the metal is removed.

For the same reason, it is possible to use different metal alloys each providing a different aesthetic effect.

The used materials, as well as the contingent size and shapes may be any, depending on requirements.

The invention claimed is:

1. A method for making wordings that are formed on a flexible sublayer, the method comprising:
   providing said flexible sublayer by a synthetic single thread that is woven into a square mesh fabric having an even construction and a mesh opening therethrough with constant weight, thickness, surface characteristics and temperature performance, said synthetic single thread being made of polyester, polyamide, polypropylene, polyethersulphone, polyimide, polyamide-imide, polyphenilensulphide, polyethereterketone, polyvinylidenfluoride, polytetrafluoroethylene, said flexible sublayer having a mesh opening range from 2,500 to 0 microns, 4-600 threads/cm, a thread diameter of 100-500 microns, a 15-300 g/m$^2$ weight, a 15-1,000 micron thickness;
   applying at least one metal coating either on one or both surfaces of said sublayer;
   an etching step, performed by a laser beam, such that said laser beam is absorbed by said metal coating without modifying a polymeric bulk and surface of said sublayer, and such that said laser beam does not alter said mesh opening thereby preserving perspiring, acoustic and filtering properties of said square mesh fabric, and such that said metal coating is vaporized by said laser beam, said polymeric bulk and surface being transparent to said laser beam, said laser beam being a low power high density laser beam, operating either in a continuous or pulsed regimen range with a frequency of 100 Hz to 500 MHz, a pulse duration from 200 ns to 10 femtoseconds thereby favoring an evaporation of said metal coating while limiting a heat diffusion to said sublayer, a wavelength from 1,080 nm to 354 nm, a power between 5 to 100 W, a laser beam spot with a size from 10 to 200 microns, such that said laser beam is focalized on said sublayer by a micrometrically controlled focalizing lens system, and such that said laser beam is driven through said flexible sublayer by a combined movement of said laser beam and flexible sublayer, simultaneously with a flexible sublayer driving movement, wherein wordings are formed on said flexible sublayer, and wherein said method comprises a step of providing a cooling system for preventing said fabric from being subjected to degradation phenomena as said metal coating is laser beam vaporized as a combination of the metal evaporation latent heat and thickness thereof achieves such a level as to cause heat to be conductively transferred to said sublayer.

2. A method according to claim 1, wherein said laser beam is driven by Cartesian axis driving means, a robot arm, a lens and/or reflecting mirror system including a galvanometric head assembly.

3. A method according to claim 1, wherein said laser is a diode laser, a solid status laser, a fiber laser or a CO2 laser.

4. A method according to claim 1, wherein said laser beam causes a quick and localized evaporation of said metal coating without combustion, fusion or degradation phenomena of said flexible sublayer.

5. A method according to claim 1, wherein the removal of said metal coating by said laser beam is carried out on either a surface or on both surfaces of said sublayer simultaneously.

6. A method according to claim 1, wherein said step of applying said metal coating is carried out by sputtering, PVD, CVD, a galvanic deposition, or a chemical deposition.

7. A method according to claim 1, wherein said metal coating has a thickness from 10 to 5,000 nm and is either a single layer or a multiple layer metal coating.

8. A method according to claim 1, wherein said metal coating is made of metal materials and alloys thereof or semiconductor materials selected from nickel, gold, steel, copper, silver, aluminium, chromium, titanium, tin, indium-tin oxide, zinc-aluminium oxide, tin-fluorine oxide, tin-antimonium oxide.

9. A method according to claim 1, wherein said sublayer is made of either a white or a colored fabric material.

10. A fabric made by a method according to claim 1, said fabric having wordings that are formed on a flexible sublayer, said flexible sublayer provided by a synthetic single thread that is woven into a square mesh fabric having an even construction and a mesh opening therethrough with constant weight, thickness, surface characteristics and temperature performance, said flexible sublayer including sublayer surfaces at least partially coated by a metal coating, said single thread being made of polyester, polyamide, polypropylene, polyethersulphone, polyimide, polyamide-imide, polyphenilensulphide, polyethereterketone, polyvinylidenfluoride, polytetrafluoroethylene, said flexible sublayer having said mesh opening with a range from 2,500 to 0 microns, 4-600 threads/cm, a thread diameter of 100-500 microns, a 15-300 $g/m^2$ weight, a 15-1,000 micron thickness, said metal coating being etched by a laser beam which has been absorbed by said metal coating, and said metal coating being cooled as said metal coating is vaporized by said laser beam, without modifying a polymeric bulk and surface of said sublayer and such that said polymeric bulk and surface being transparent to said laser beam and such that said laser beam does not alter said mesh opening thereby preserving perspiring, acoustic and filtering properties of said square mesh fabric, wherein said laser beam being a low power high density laser beam, operating either in a continuous or pulsed regimen range with a frequency of 100 Hz to 500 MHz, a pulse duration from 200 ns to 10 femtoseconds thereby favoring an evaporation of said metal coating while limiting a heat diffusion to said sublayer, a wavelength from 1,080 nm to 354 nm, a power between 5 to 100 W, a laser beam spot with a size from 10 to 200 microns, such that said laser beam has been focalized on said sublayer by a micrometrically controlled focalizing lens system, and such that said laser beam has been driven through said flexible sublayer by a combined movement of said laser beam and flexible sublayer, simultaneously with a flexible sublayer driving movement.

\* \* \* \* \*